(12) United States Patent
Kurosawa

(10) Patent No.: US 11,587,599 B2
(45) Date of Patent: Feb. 21, 2023

(54) MEMORY SYSTEM, MEMORY CHIP, AND CONTROLLER FOR TWO DIFFERENT VOLTAGE RANGES

(71) Applicant: KIOXIA CORPORATION, Tokyo (JP)

(72) Inventor: Takehisa Kurosawa, Yokohama Kanagawa (JP)

(73) Assignee: KIOXIA CORPORATION, Tokyo (JP)

(*) Notice: Subject to any disclaimer, the term of this patent is extended or adjusted under 35 U.S.C. 154(b) by 0 days.

(21) Appl. No.: 17/189,604

(22) Filed: Mar. 2, 2021

(65) Prior Publication Data

US 2021/0375337 A1    Dec. 2, 2021

(30) Foreign Application Priority Data

May 29, 2020    (JP) .............................. JP2020-094852

(51) Int. Cl.
G11C 7/10    (2006.01)
G11C 7/12    (2006.01)

(52) U.S. Cl.
CPC ............ *G11C 7/1063* (2013.01); *G11C 7/109* (2013.01); *G11C 7/12* (2013.01)

(58) Field of Classification Search
CPC ......... G11C 7/1063; G11C 7/109; G11C 7/12; G11C 16/20; G11C 16/26
See application file for complete search history.

(56) References Cited

U.S. PATENT DOCUMENTS

| | | | |
|---|---|---|---|
| 7,974,142 B2 * | 7/2011 | Do | G11C 7/1069 365/194 |
| 8,769,160 B2 | 7/2014 | Park et al. | |
| 10,235,306 B2 | 3/2019 | Kodera et al. | |
| 2004/0192504 A1 * | 9/2004 | Kumazawa | B60W 30/18027 477/166 |
| 2015/0234726 A1 | 8/2015 | Moran et al. | |
| 2018/0131374 A1 * | 5/2018 | Choi | H03K 19/0005 |

FOREIGN PATENT DOCUMENTS

| | | |
|---|---|---|
| JP | 2009-181473 A | 8/2009 |
| JP | 2012-133783 A | 7/2012 |
| JP | 2017-512326 A | 5/2017 |
| JP | 2018-022383 A | 2/2018 |

* cited by examiner

*Primary Examiner* — Sultana Begum
(74) *Attorney, Agent, or Firm* — Kim & Stewart LLP

(57) ABSTRACT

A memory system includes a memory chip, one or more signal lines including a first signal line, and a controller. The controller is connected to the memory chip via the one or more signal lines. The controller is configured to transmit and receive signals via the first signal line in accordance with a first standard under which voltages of communicated signals transition in a first range and with a second standard under which voltages of communicated signals transition in a second range narrower than the first range. The controller is configured to transmit a command to the memory chip via the first signal line in accordance with the first standard, and based on a response to the command from the memory chip, enable communication in accordance with the second standard.

19 Claims, 10 Drawing Sheets

MEMORY SYSTEM, MEMORY CHIP, AND CONTROLLER FOR TWO DIFFERENT VOLTAGE RANGES

CROSS-REFERENCE TO RELATED APPLICATION(S)

This application is based upon and claims the benefit of priority from Japanese Patent Application No. 2020-094852, filed May 29, 2020, the entire contents of which are incorporated herein by reference.

FIELD

Embodiments described herein relate generally to a memory system, a memory chip, and a controller.

BACKGROUND

A memory chip of a flash memory type may be configured to communicate using electrical signals of either of two different incompatible types of input-output standards (IO standards).

DETAILED DESCRIPTION

Embodiments provide a memory system with improved performance.

In general, according to an embodiment, a memory system includes a memory chip, one or more signal lines including a first signal line, and a controller. The controller is connected to the memory chip via the one or more signal lines. The controller is configured to transmit and receive signals via the first signal line in accordance with a first standard under which voltages of communicated signals transition in a first range and with a second standard under which voltages of communicated signals transition in a second range narrower than the first range. The controller is configured to transmit a command to the memory chip via the first signal line in accordance with the first standard, and based on a response to the command from the memory chip, enable communication in accordance with the second standard.

Hereinafter, a memory system, a memory chip, and a controller according to embodiments will be described with reference to the accompanying drawings. The present disclosure is not limited to these example embodiments.

First Embodiment

Figure 1:
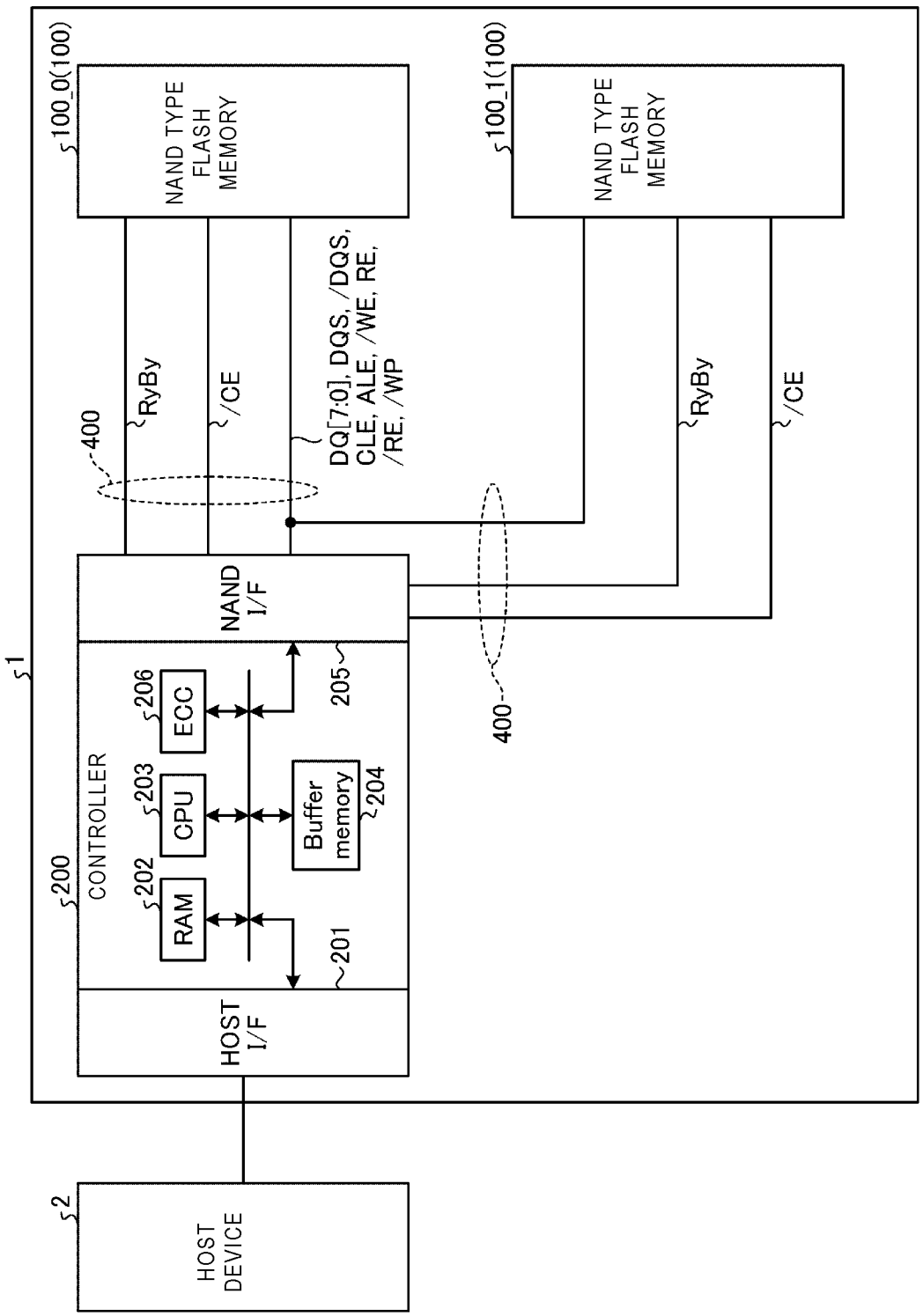
FIG. 1 is a diagram of a memory system according to a first embodiment.

FIG. 1 is a diagram showing a configuration example of a memory system according to a first embodiment. As shown in FIG. 1, a memory system 1 can be connected to a host device 2. The host device 2 corresponds to, for example, a server, a personal computer, a mobile information processing device, or the like. The memory system 1 functions as an external storage device of the host device 2. The host device 2 can issue a request to the memory system 1. The request may be, for example, a read request or a write request.

The memory system 1 includes one or more memory chips 100 and one controller 200. Here, the memory system 1 includes memory chips 100_0 and 100_1 as the one or more memory chips 100. The number of memory chips 100 provided in the memory system 1 is not limited to two. Each memory chip 100 is a NAND-type flash memory.

The controller 200 executes data transmission or the like between the host device 2 and the two memory chips 100 based on the request from the host device 2. The controller 200 instructs the two memory chips 100 to perform read operations, program operations, erase operations, or the like as necessary to perform the requested data transmission.

The controller 200 includes a host interface (I/F) circuit 201, a memory (RAM) 202, a processor (CPU) 203, a buffer memory 204, a NAND interface circuit 205, and an error correction code (ECC) circuit 206. The controller 200 may be implemented as, for example, a system-on-a-chip (SoC). The controller 200 may be configured as a plurality of chips. The controller 200 may comprise a field-programmable gate array (FPGA) or an application specific integrated circuit (ASIC) instead of the CPU 203. That is, the controller 200 may be configured with software, hardware, or a combination thereof.

The host interface circuit 201 is connected to the host device 2 via a bus that conforms to, for example, the serial advanced technology attachment (SATA) standard, the serial attached SCSI (SAS) standard, or the peripheral components interconnect (PCI) Express® (standard, and controls communication between the controller 200 and the host device 2.

The NAND interface circuit 205 is connected to each memory chip 100 via a NAND bus 400, and controls communication between the controller 200 and the memory chips 100.

The CPU 203 controls an operation of the controller 200.
The RAM 202 is used as a work area for the CPU 203. The RAM 202 stores firmware for managing the memory chips 100, various management tables, or the like. The buffer memory 204 temporarily stores data to be transmitted to the memory chips 100 and data transmitted from the memory chips 100. The RAM 202 and the buffer memory 204 may be configured with, for example, a dynamic random access memory (DRAM), a static random access memory (SRAM), or a combination thereof. The types of memory that can be utilized for the RAM 202 and the buffer memory 204 are not limited thereto.

The ECC circuit 206 detects and corrects data errors using an error correction code.

Each memory chip 100 includes a plurality of memory cell transistors and can store data in a non-volatile manner. Each memory chip 100 is connected to the controller 200 via the NAND bus 400, and operates based on an instruction from the controller 200. Each memory chip 100 transmits and receives, for example, an 8-bit input-output signal DQ[7:0] to and from the controller 200. The input-output signal DQ[7:0] is, for example, a command, an address, and data. Further, each memory chip 100 receives a control signal transmitted from the controller 200.

The control signal includes a chip enable signal /CE, a pair of strobe signals DQS and /DQS, a command latch enable signal CLE, an address latch enable signal ALE, a write enable signal /WE, a pair of read enable signals RE and /RE, a write protect signal /WP, or the like. The "/" means negative logic.

The chip enable signal /CE is a signal for enabling the memory chip 100 which is a target. The signals DQ[7:0], DQS, /DQS, CLE, ALE, /WE, RE, /RE, and /WP are commonly input to the two memory chips 100_0 and 100_1. The chip enable signal /CE is input to the two memory chips 100_0 and 100_1 individually. The memory chip 100 in the two memory chips 100_0 and 100_1 which is enabled by the chip enable signal /CE can execute operations corresponding to the signals DQ[7:0], DQS, /DQS, CLE, ALE, /WE, RE, /RE, and /WP.

The pair of strobe signals DQS and /DQS are signals instructing the memory chip 100 to take in data of the input-output signal DQ[7:0] to a destination. The pair of strobe signals DQS and /DQS can be transmitted by the controller 200 to the memory chip 100, or can be transmitted by the memory chip 100 to the controller 200. The pair of strobe signals DQS and /DQS can be transmitted from the controller 200 or the memory chip 100 which is a transmission source of the input-output signal DQ[7:0].

The command latch enable signal CLE is a signal indicating that the input-output signal DQ[7:0] is a command. The address latch enable signal ALE is a signal indicating that the input-output signal DQ[7:0] is an address. The write enable signal /WE is a signal instructing the memory chip 100 to take in a command of the input-output signal DQ[7:0]. The pair of read enable signals RE and /RE are signals instructing the memory chip 100 to output the input-output signal DQ[7:0]. The write protect signal /WP is a signal instructing the memory chip 100 to prohibit execution of program operation and erase operation.

A status signal indicates various states of the memory chip 100 and includes a ready busy signal RyBy. The ready busy signal RyBy is a signal indicating whether the memory chip 100 is in a ready state (Ry) or a busy state (By). The ready state (Ry) is a state in which the memory chip 100 can receive a command from the controller 200, and the busy state (By) is a state in which the memory chip 100 cannot receive a command from the controller 200. The ready busy signal RyBy can be transmitted to the controller 200 from each of the two memory chips 100_0 and 100_1. The controller 200 can know a state of each memory chip 100 by receiving the status signal and the ready busy signal RyBy.

Figure 2:
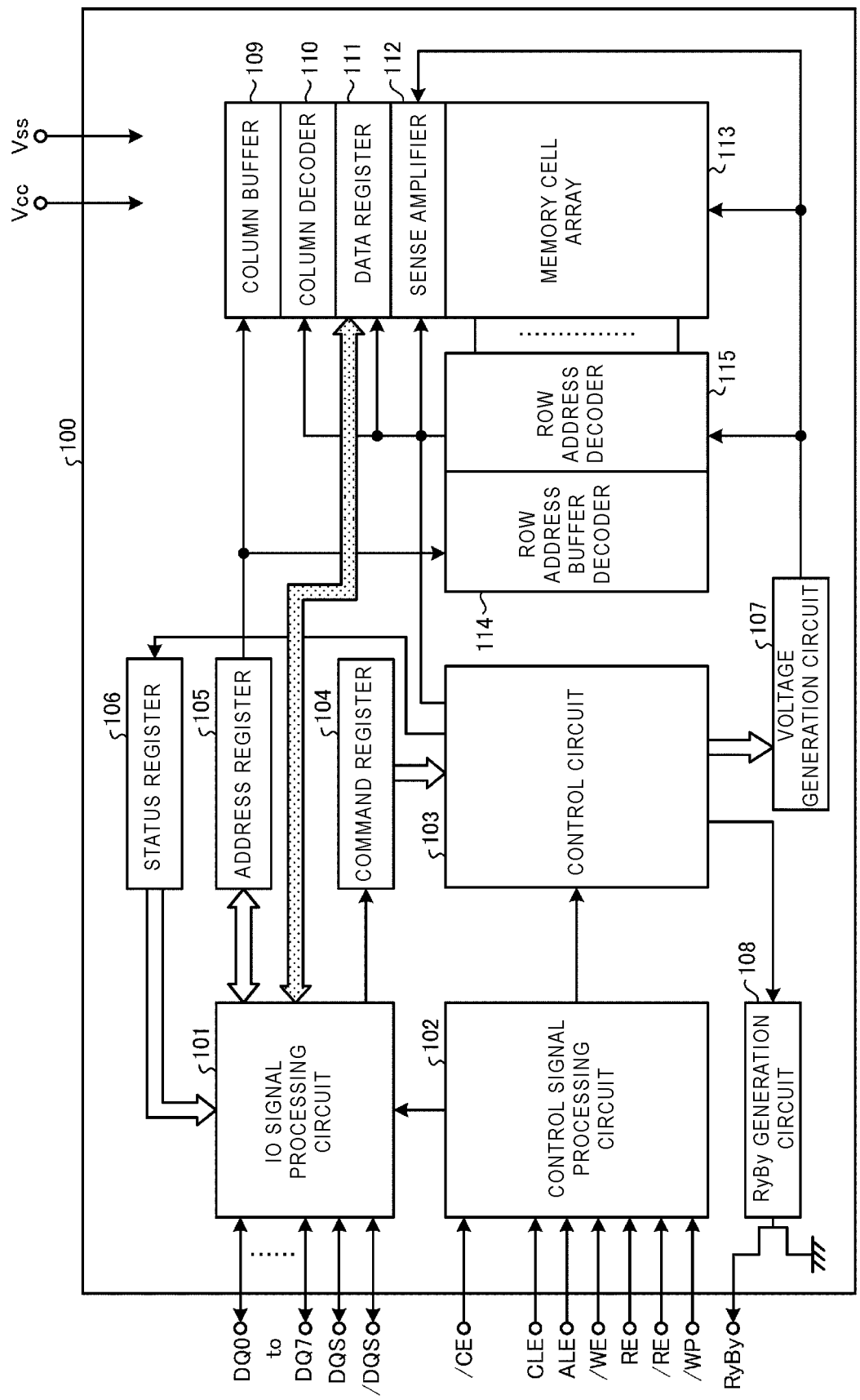
FIG. 2 is a diagram showing of a memory chip according to a first embodiment.

FIG. 2 is a diagram showing a configuration example of each memory chip 100 according to the first embodiment.

The memory chip 100 includes an IO signal processing circuit 101, a control signal processing circuit 102, a control circuit 103, a command register 104, an address register 105, a status register 106, a voltage generation circuit 107, a RyBy generation circuit 108, a column buffer 109, a column decoder 110, a data register 111, a sense amplifier 112, a memory cell array 113, a row address buffer decoder 114, and a row address decoder 115.

Further, the memory chip 100 includes a Vcc terminal that receives power from a power supply integrated circuit (IC) provided in the memory system 1 and a Vss terminal to which a ground potential is connected. The power received by the Vcc terminal is supplied to each circuit in the memory chip 100.

The control signal processing circuit 102 receives a control signal, determines, based on the received control signal, whether an IO signal transmitted to the IO signal processing circuit 101 is a command, an address, or data, and notifies the IO signal processing circuit 101 of a determination result. Further, the control signal processing circuit 102 transmits the received control signal to the control circuit 103.

The IO signal processing circuit 101 is a buffer circuit for transmitting and receiving the input-output signal DQ[7:0] to and from the controller 200. The IO signal processing circuit 101 can take in, based on the pair of strobe signals DQS and /DQS, the data transmitted as the input-output signal DQ[7:0]. The IO signal processing circuit 101 distributes and stores the command, the address, and the data transmitted as the input-output signal DQ[7:0] into the command register 104, the address register 105, and the data register 111, respectively.

The address stored in the address register 105 includes a row address and a column address. The row address is transmitted to the row address buffer decoder 114, and the column address is transmitted to the column buffer 109.

The control circuit 103 is a state transition circuit (state machine) that makes a state transition based on various control signals received via the control signal processing circuit 102. The control circuit 103 controls the operation of the entire memory chip 100 based on various control signals and the command stored in the command register 104.

Further, the control circuit 103 generates status information indicating an operation control state or an operation control result, and stores the status information into the status register 106. The control circuit 103 can output, via the IO signal processing circuit 101, the status information stored in the status register 106 in response to a status read command from the controller 200 or the like.

The RyBy generation circuit 108 transitions the state of the ready busy signal RyBy between the ready state (Ry) and the busy state (By) under the control of the control circuit 103.

The memory cell array 113 includes a plurality of memory cell transistors that are arranged. Each of the plurality of memory cell transistors is connected to a bit line BL and a word line WL. Data received from the host device 2 is stored in the memory cell array 113.

The voltage generation circuit 107 generates, based on the power input to the Vcc terminal, various voltages required for access (program operation, read operation, and erase operation) to the memory cell array 113. Then, the voltage generation circuit 107 supplies the generated voltages to the sense amplifier 112, the memory cell array 113, and the row address decoder 115, respectively.

The row address decoder 115, the column decoder 110, and the sense amplifier 112 execute, based on the control of the control circuit 103, the access (program operation, read operation, and erase operation) to the memory cell array 113.

For example, during the program operation, the column decoder 110 selects a bit line BL corresponding to the column address stored in the column buffer 109. The control circuit 103 sets a voltage of the selected bit line to zero. The row address decoder 115 selects a word line corresponding to the row address stored in the row address buffer decoder 114, and applies, to the selected word line, a high voltage pulse generated by the voltage generation circuit 107. Then, electrons are injected into a charge storage layer of a memory cell located at an intersection of the selected bit line and the selected word line, and as a result, a threshold voltage of the memory cell rises. The control circuit 103 causes the row address decoder 115 to continue to apply the pulse until the threshold voltage of the memory cell reaches a target state corresponding to the data stored in the data register 111.

During the read operation, the sense amplifier 112 precharges the bit line BL to a voltage Vcc. The row address decoder 115 selects the word line corresponding to the row address stored in the row address buffer decoder 114. The row address decoder 115 sets a memory cell belonging to a non-selected word line into a conductive state by applying, to the word line, a predetermined voltage Vread generated by the voltage generation circuit 107. Then, the row address decoder 115 sequentially applies a plurality of types of voltages, which are generated by the voltage generation circuit 107 and correspond to types of pages to be read, to the selected word line. The sense amplifier 112 specifies a state to which a target memory cell belongs by specifying a voltage that causes the charge stored by precharging to flow out to a source line, and obtains data corresponding to the identified state. The sense amplifier 112 stores the obtained data into the data register 111. The data stored in the data register 111 is transmitted to the IO signal processing circuit 101 via a data line, and is transmitted from the IO signal processing circuit 101 to the controller 200.

As described above, the memory chip may be configured to communicate using either one of the two types of input-output standards (IO standard) that are incompatible with each other. A technology in which a memory chip is configured to communicate using both of the two types of s standards that are incompatible with each other is described as a comparative example.

According to this comparative example, the memory chip includes two different interface circuits, one capable of transmitting and receiving the electric signals of each one of the different input-output standards, and a signal line between the controller and the memory chip (for example, a signal line of the input-output signal DQ[7:0]) is commonly connected to both of the two different interface circuits. Then, an IO standard of one of the two types of IO standards supported by the memory chip to be used for communication between the controller and the memory chip can be selected or set according to a design specification or a setting of the controller.

For example, when the controller of the comparative example supports only one of the two different IO standards supported by the memory chip, the IO standard supported by the controller is selected. Alternatively, if the controller of the comparative example supports both IO standards, then one of the two types is selected according to information preset in the controller.

The interface circuit in the memory chip of the comparative example for the non-selected input-output standard is not used even though this interface circuit is electrically connected to the signal line. Since the unused interface circuit is still connected to the signal line, a capacitance of the signal line increases unnecessarily in the comparative example. When a signal line, for example, the signal line of the input-output signal DQ[7:0] shown in FIG. 1 is commonly connected to a plurality of memory chips, the capacitance of the signal line increases unnecessarily as the number of memory chips commonly connected to the signal line increases. As the capacitance of the signal line increases, a transmission rate of data transmitted via the signal line decreases and power consumed during data transmission increases.

To address such issues, in the first embodiment, the controller supports two input-output standards so that communication between the controller and the memory chip can be established even when the memory chip supports only one of the two input-output standards. As a result, the memory system can be configured such that an unnecessary increase in the capacitance of the signal line caused by the unused interface circuit being provided in the memory chip can be avoided.

Figure 3A:
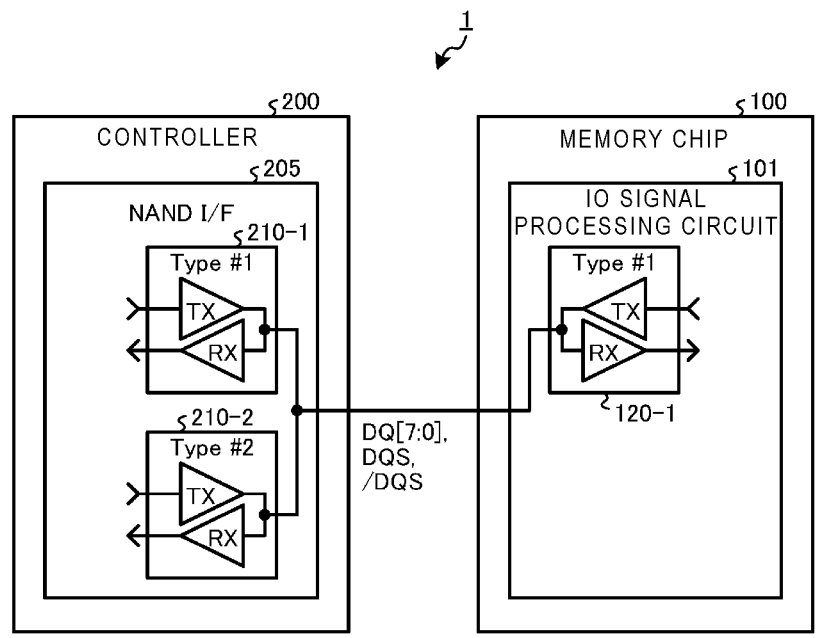
FIGS. 3A and 3B are diagrams of interface circuits of a controller and a memory chip according to a first embodiment.
Figure 3B:
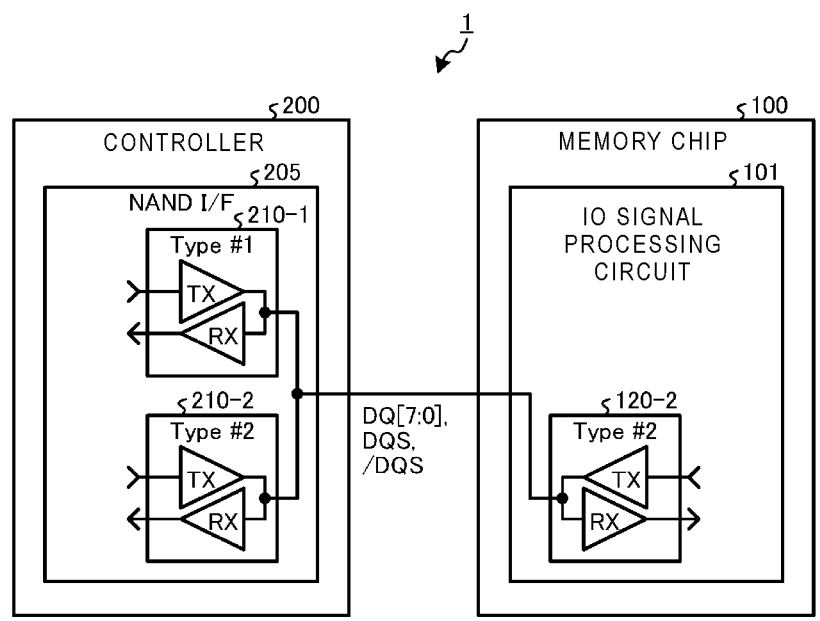

Each of FIG. 3A and FIG. 3B is a diagram showing a configuration example of respective interface circuits of the controller 200 and the memory chip 100 according to the first embodiment. In the following description, one of the two different types of input-output standards is referred to as Type #1, and the other is referred to as Type #2.

In an example shown in FIG. 3A and an example shown in FIG. 3B, the NAND interface circuit 205 provided in the controller 200 includes an interface circuit 210-1 that can transmit and receive a Type #1 electrical signal and an interface circuit 210-2 that can transmit and receive a Type #2 electrical signal. The interface circuit 210-1 and the interface circuit 210-2 are provided for each specific signal line (referred to as a first signal line) in a signal line group implementing the NAND bus 400. Then, a pair of the interface circuit 210-1 and the interface circuit 210-2 are commonly connected to each first signal line. The first signal line is, for example, a signal line for transmitting the input-output signal DQ[7:0], a signal line for transmitting the strobe signal DQS, and a signal line for transmitting the strobe signal /DQS. The interface circuit 210-1 includes a transmission circuit TX that can transmit the Type #1 electric signal and a reception circuit RX that can receive the Type #1 electric signal. Further, the interface circuit 210-2 includes a transmission circuit TX that can transmit the Type #2 electric signal and a reception circuit RX that can receive the Type #2 electric signal.

According to the example shown in FIG. 3A, the IO signal processing circuit 101 provided in the memory chip 100 includes, for each first signal line, an interface circuit 120-1 that can transmit and receive the Type #1 electric signal, and the first signal line is connected to the interface circuit 120-1 in the memory chip 100. The interface circuit 120-1 includes the transmission circuit TX that can transmit the Type #1 electric signal and the reception circuit RX that can receive the Type #1 electric signal. The IO signal processing circuit 101 does not include an interface circuit that can transmit and receive the Type #2 electric signal.

Further, according to the example shown in FIG. 3B, the IO signal processing circuit 101 provided in the memory chip 100 includes, for each first signal line, an interface circuit 120-2 that can transmit and receive the Type #2 electric signal, and the first signal line is connected to the interface circuit 120-2 in the memory chip 100. The interface circuit 120-2 includes the transmission circuit TX that can transmit the Type #2 electric signal and the reception circuit RX that can receive the Type #2 electric signal. The IO signal processing circuit 101 does not include an interface circuit that can transmit the Type #1 electric signal.

As described above, according to the first embodiment, the memory chip 100 includes either one of the interface circuit 120-1 that can transmit and receive the Type #1 electric signal and the interface circuit 120-2 that can transmit and receive the Type #2 electric signal. The controller 200 includes the interface circuit 210-1 that can transmit and receive the Type #1 electric signal and the interface circuit 210-2 that can transmit and receive the Type #2 electric signal so that the controller 200 can communicate with the memory chip 100 regardless of whether the memory chip 100 supports Type #1 or Type #2.

The memory chips 100 that share the first signal line, that is, the memory chip 100_0 and the memory chip 100_1 in this example, may support the same type of input-output standard. That is, both the memory chip 100_0 and the memory chip 100_1 have the configuration shown in FIG. 3A, or both have the configuration shown in FIG. 3B.

Next, specific examples of Type #1 and Type #2 will be described. Type #1 and Type #2 are different from each other in terms of a transition range (swinging range) of a voltage of an electric signal.

Figure 4:
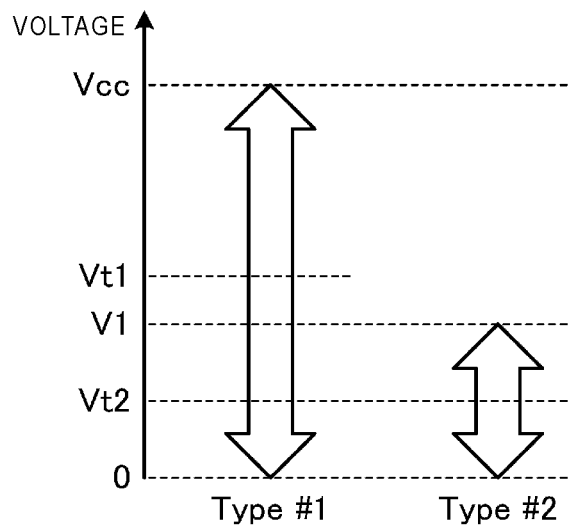
FIG. 4 is a diagram showing an example of transition ranges of voltages of electric signals according to two different types of input-output standards (Type #1 and Type #2) that are supported by a controller according to a first embodiment.

FIG. 4 is a diagram showing an example of transition ranges of voltages of electric signals of the two types of input-output standards (Type #1 and Type #2) supported by the controller 200 according to the first embodiment. Here, as an example, it is assumed that Type #1 is stub series termination logic (SSTL) and Type #2 is low voltage swing terminated logic (LVSTL). The examples of Type #1 and Type #2 are not limited thereto.

As shown in FIG. 4, according to Type #1, a voltage of an electric signal transitions in a range from 0 to a power supply voltage Vcc. The transmission circuits TX of the interface circuit 210-1 and the interface circuit 1201-1 set a voltage of the signal line to the power supply voltage Vcc when transmitting an H level signal. The transmission circuits TX of the interface circuit 210-1 and the interface circuit 120-1 set the voltage of the signal line to 0 when transmitting an L level signal. This characteristic is caused by, for example, that the transmission circuits TX of the interface circuit 210-1 and the interface circuit 120-1 are each implemented by a complementary metal-oxide-semiconductor (CMOS).

Further, according to Type #1, a voltage value Vt1 between 0 and the power supply voltage Vcc is used for determining whether the signal indicates an H level or an L level. That is, the reception circuits RX of the interface circuit 210-1 and the interface circuit 120-1 determine that, if a voltage of a signal line is higher than the voltage value Vt1, a level of the signal received from the signal line is an H level. Further, the reception circuits RX of the interface circuit 210-1 and the interface circuit 120-1 determine that, if a voltage of a signal line is lower than the voltage value Vt1, a level of the signal received from the signal line is an L level.

On the other hand, according to Type #2, a voltage of an electric signal transitions in a range narrower than that of the Type #1 electric signal. Specifically, in an example of FIG. 4, the voltage of the electric signal transitions in a range from 0 to a voltage V1 lower than the power supply voltage Vcc. The transmission circuits TX of the interface circuit 210-2 and the interface circuit 120-2 set a voltage of the signal line to the voltage V1 when transmitting an H level signal. The transmission circuits TX of the interface circuit 210-2 and the interface circuit 120-2 set the voltage of the signal line to 0 when transmitting an L level signal. This characteristic is caused by, for example, that the transmission circuits TX of the interface circuit 210-2 and the interface circuit 120-2 are each implemented by only a NMOS.

Further, according to Type #2, a voltage value Vt2 between 0 and the voltage Vt1 is used for determining whether the signal indicates an H level or an L level. That is, the reception circuits RX of the interface circuit 210-2 and the interface circuit 120-2 determine that, if a voltage of a signal line is higher than the voltage value Vt2, a level of the signal received from the signal line is an H level. Further, the reception circuits RX of the interface circuit 210-2 and the interface circuit 120-2 determine that, if a voltage of a signal line is lower than the voltage value Vt2, a level of the signal received from the signal line is an L level.

According to Type #2, the voltage of the electric signal transitions in a narrower range as compared with that of Type #1. Therefore, according to Type #2, a transmission rate of data can be increased as compared with that of Type #1. Further, according to Type #2, data can be transmitted with less power consumption as compared with that of Type #1.

Type #1 corresponds to a first standard. Type #2 corresponds to a second standard. The Type #1 electrical signal corresponds to a first electrical signal. The Type #2 electrical signal corresponds to a second electrical signal. A range from 0 volt to the power supply voltage Vcc, which is a transition range of the Type #1 electric signal, corresponds to a first range. A range from 0 volt to the V1, which is a transition range of the Type #2 electric signal, corresponds to a second range. 0 volt, which is a lower limit of the transition range of the Type #1 electric signal and also a lower limit of the transition range of the Type #2 electric signal, corresponds to a first value. The power supply voltage Vcc, which is an upper limit of the transition range of the Type #1 electric signal, corresponds to a second value. The V1, which is an upper limit of the transition range of the Type #2 electric signal, corresponds to a third value.

As described above, the controller 200 supports both Type #1 and Type #2, but the memory chip 100 supports only one of Type #1 and Type #2. For that reason, in order to establish the communication between the controller 200 and the memory chip 100, the controller 200 needs to select an interface circuit corresponding to the input-output standard supported by the memory chip 100 from the interface circuits 210-1 and 210-2 provided in the controller 200.

To achieve the objective, the controller 200 transmits a command for identifying whether the memory chip 100 supports Type #1 or Type #2 to the memory chip 100. The command is referred to as an interface identification command. The interface identification command corresponds to a first command.

The controller 200 transmits the interface identification command when starting communication with the memory chip 100. A destination of the interface identification command may be all the memory chips 100 connected to the controller 200, or may be a part of the memory chips 100 connected to the controller 200. For example, the destination of the interface identification command may be one of the plurality of memory chips sharing the first signal line. The controller 200 transmits the interface identification command to the memory chips 100 when the memory system 1 is powered on, for example. When receiving a response to the interface identification command, the controller 200 subsequently communicates with the two memory chips 100 by using an interface circuit in the interface circuits 210-1 and 210-2 which corresponds to the response.

The controller 200 uses the interface circuit 210-1 for Type #1 electric signal to transmit the interface identification command. The reason is as described hereinafter.

The transition range of the voltage of the Type #1 electric signal is wider than the transition range of the voltage of the Type #2 electric signal. For that reason, the reception circuit RX for Type #2 electric signal can correctly receive the Type #1 electric signal transmitted from the transmission circuit TX for Type #1 electric signal. Correct reception means that a signal transmitted as an H level signal can be received as an H level signal, and a signal transmitted as an L level signal can be received as an L level signal.

On the other hand, the reception circuit RX for Type #1 electric signal cannot correctly receive the Type #2 electric signal transmitted from the transmission circuit TX for Type #2 electric signal. For example, according to the example shown in FIG. 4, both the signal transmitted as an L level signal and the signal transmitted as an H level signal by the transmission circuit TX for Type #2 electric signal are received as an L level signal in the reception circuit RX for Type #1 electric signal.

When transmitting the interface identification command, the controller 200 uses the interface circuit 210-1 for transmitting and receiving the Type #1 electrical signal. Accordingly, the memory chip 100 can correctly receive the interface identification command regardless of whether the memory chip 100 supports Type #1 or Type #2.

The controller 200 receives the response to the interface identification command by the interface circuit 210-1. Here, as is clear from the description using FIG. 4, in Type #2, the signal received as an H level signal by the reception circuit RX for Type #1 electrical signal cannot be transmitted. As a result, when the response is received as an H level signal by the interface circuit 210-1, the controller 200 determines that the memory chip 100 supports Type #1, and when the response is received as an L level signal by the interface circuit 210-1, the controller 200 determines that the memory chip 100 supports Type #2.

When the memory chip 100 itself supports Type #1, the memory chip 100 transmits an H level electric signal as a response to the interface identification command. That is, the interface circuit 120-1 sets the voltage of the signal line to the power supply voltage Vcc. Accordingly, the interface circuit 210-1 of the controller 200 receives the response as an H level signal, and it can be determined that the memory chip 100 supports Type #1.

Further, when the memory chip 100 itself supports Type #2, the memory chip 100 transmits an L level electric signal as a response to the interface identification command. That is, the interface circuit 120-2 sets the voltage of the signal line to 0. Accordingly, the interface circuit 210-1 of the controller 200 receives the response as an L level signal, and it can be determined that the memory chip 100 supports Type #2.

Figure 5:
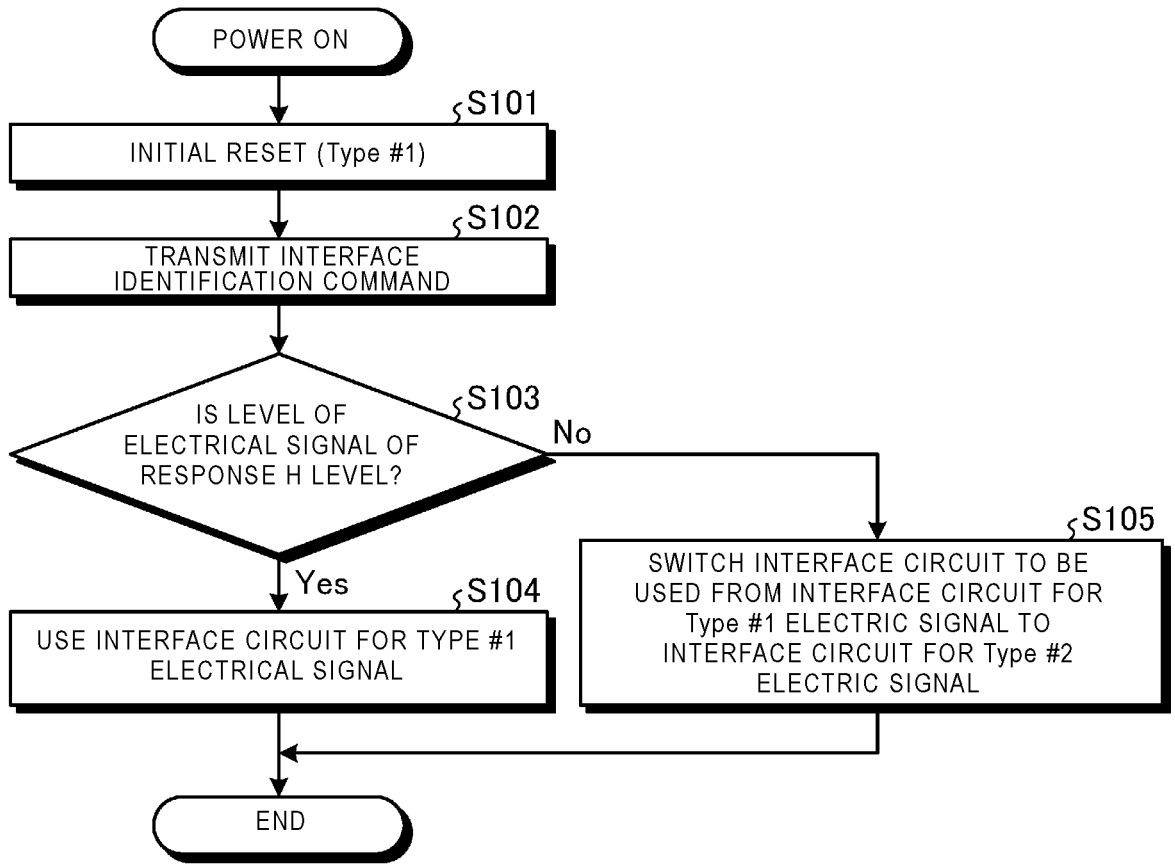
FIG. 5 is a flowchart of an operation of a controller according to a first embodiment.

Next, an operation of the memory system 1 according to the first embodiment will be described. FIG. 5 is a flowchart showing an example of the operation of the controller 200 according to the first embodiment.

When the memory system 1 is powered on, the controller 200 and the memory chip 100 each performs an initial reset (initialization). Specifically, each of the controller 200 and the memory chip 100 issues a power-on reset signal, and resets each circuit provided in the controller 200 or the memory chip 100 according to the power-on reset signal. The controller 200 performs a reset in the NAND interface circuit 205 such that the interface circuit 210-1 for Type #1 electric signal can be used (S101).

Subsequently, the controller 200 transmits the interface identification command to one memory chip 100 using the interface circuit 210-1 for Type #1 electric signal (S102). The destination of the interface identification command may be a plurality of memory chips 100.

Subsequently, in the controller 200, the interface circuit 210-1 for Type #1 electric signal receives the response to the interface identification command. When the interface circuit 210-1 for Type #1 electric signal receives an electrical signal of the response as an H level signal (S103: Yes), it is determined that the memory chip 100 supports Type #1, and it is determined that the interface circuit 210-1 for Type #1 electrical signal will be used thereafter (S104).

When the interface circuit 210-1 for Type #1 electric signal receives an electrical signal of the response as an L level signal (S103: No), it is determined that the memory chip 100 supports Type #2, and an interface circuit to be used thereafter is switched from the interface circuit 210-1 for Type #1 electric signal to the interface circuit 210-2 for Type #2 electric signal (S105).

The operation of the controller 200 according to the first embodiment is completed by S104 and S105. Subsequently, the controller 200 communicates with the two memory chips 100 by using the interface circuit determined by S104 or S105.

Figure 6:
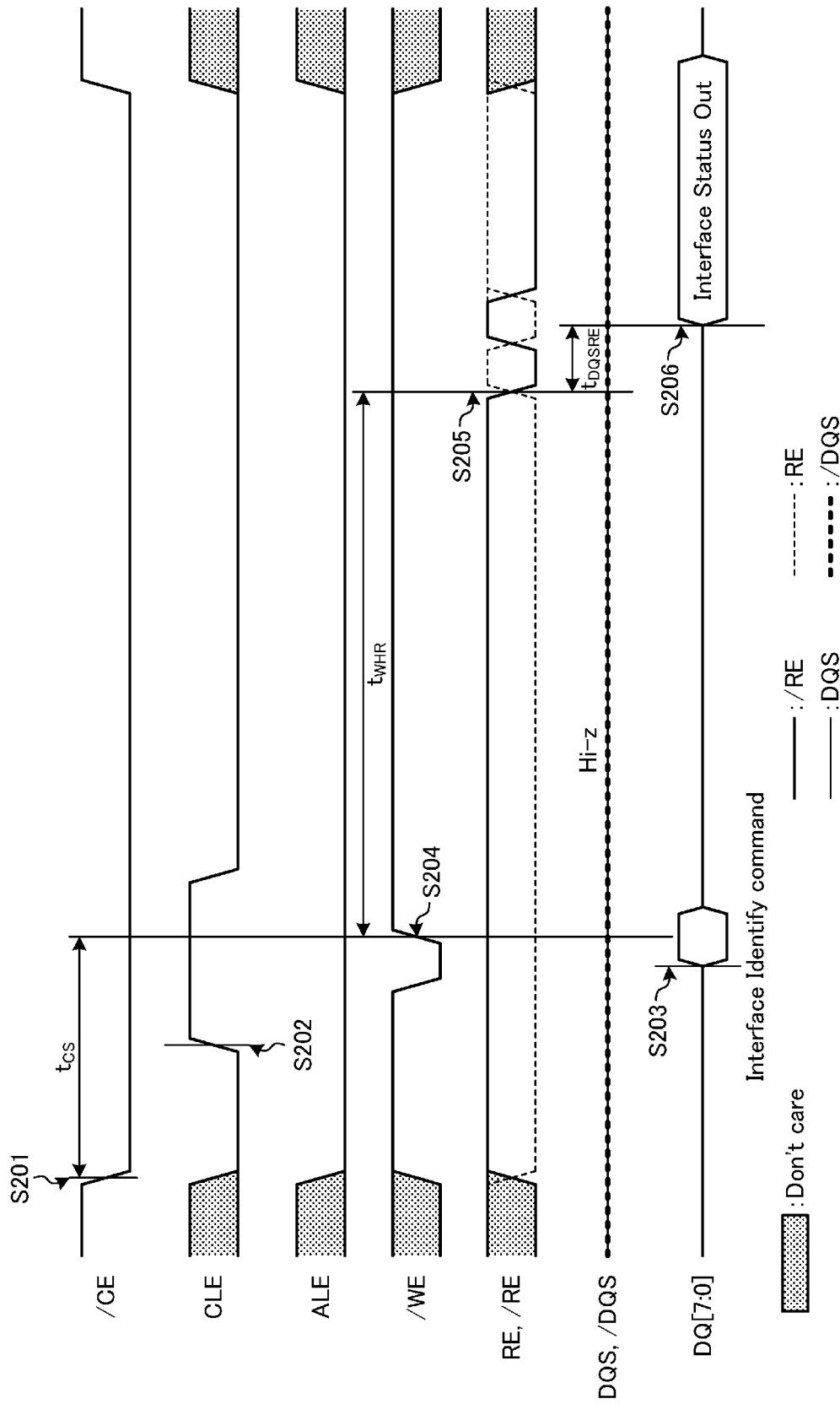
FIG. 6 is a timing chart showing an example of a state transition of a NAND bus during transmitting and receiving of an interface identification command and a response in a memory system according to a first embodiment.

FIG. 6 is a timing chart showing an example of a state transition of the NAND bus 400 during transmitting and receiving of an interface identification command and a response in the memory system 1 according to the first embodiment. The type of the input-output standard of the electrical signals such as the signals /CE, CLE, ALE, /WE, RE, and /RE is a predetermined type (for example, Type #1) in which the electrical signals are transmitted. The signal line on which the pair of read enable signals RE and /RE are transmitted corresponds to a second signal line.

When transmitting the interface identification command, the controller 200 enables the memory chip 100 of the destination by the chip enable signal /CE (S201). That is, the chip enable signal /CE transmitted to the memory chip 100 of the destination transitions from an H level to an L level. Subsequently, when transmitting the interface identification command, the controller 200 notifies that the command is transmitted as the input-output signal DQ[7:0] by maintaining the command latch enable signal CLE at an H level (S202). Then, the controller 200 transmits the interface identification command as the input-output signal DQ[7:0] when a period of time tcs elapses after the chip enable signal /CE transitions from the H level to the L level (S203). The interface identification command is transmitted by using the interface circuit 210-1 for Type #1 electric signal.

When transmitting the interface identification command, the controller 200 instructs, by toggling the write enable signal /WE once, the memory chip 100 to take in the interface identification command transmitted as the input-output signal DQ[7:0] (S204). In FIG. 6, the interface identification command is taken into the memory chip 100 at a rising time of the write enable signal /WE.

In the memory chip 100, the IO signal processing circuit 101 takes in the interface identification command by an interface circuit which is provided in the IO signal processing circuit 101 and is the interface circuit 120-1 for type #1 electric signal or the interface circuit 120-2 for type #2 electric signal. Thereafter, a response to the interface identification command is prepared until a predetermined period of time tWHR elapses. Specifically, the interface identification command is transmitted from the IO signal processing circuit 101 to the command register 104 according to an instruction from the control signal processing circuit 102 that received the command latch enable signal CLE. The interface identification command in the command register 104 is read by the control circuit 103. The control circuit 103 generates a response in response to the interface identification command, and stores the generated response into the status register 106. For example, when the memory chip 100 including an interface circuit includes the interface circuit 120-1 for Type #1 electric signal, the control circuit 103 stores information corresponding to the H level into the status register 106. For example, when the memory chip 100 including an interface circuit includes the interface circuit 120-2 for Type #2 electric signal, the control circuit 103 stores information corresponding to the L level into the status register 106.

The controller 200 toggles the pair of read enable signals RE and /RE when the period of time tWHR elapses since the interface identification command is transmitted (S205). In the memory chip 100, when detecting the toggle of the pair of read enable signals RE and /RE, the control signal processing circuit 102 causes the IO signal processing circuit 101 to output, as the input-output signal DQ[7:0], an electric signal corresponding to the information stored in the status register 106. When the IO signal processing circuit 101 includes the interface circuit 120-1 for Type #1 electric signal, the IO signal processing circuit 101 transmits an H level signal as the input-output signal DQ[7:0] by the interface circuit 120-1. When the IO signal processing circuit 101 includes the interface circuit 120-2 for Type #2 electric signal, the IO signal processing circuit 101 transmits an L level signal as the input-output signal DQ[7:0] by the interface circuit 120-2. Accordingly, the controller 200 is in a state of being able to receive an H level response or an L level response by the interface circuit 210-1.

A period of time tDQSRE, which is required from when the pair of read enable signals RE and /RE are toggled to when the IO signal processing circuit 101 starts to output the response, is acquired by a designer by measurement or calculation. The controller 200 can take in a level of the DQ[7:0] by the interface circuit 210-1 for type #1 electric signal after a predetermined period of time, which is longer than the tDQSRE, elapses since the pair of read enable signals RE and /RE are toggled. A timing for taking in the level of the input-output signal DQ[7:0] can be determined by the controller 200 itself. For example, the controller 200 can issue an internal signal when a predetermined period of time this is longer than the period of time tDQSRE elapses after the pair of read enable signals RE and /RE are toggled in S205, and use the internal signal to take in the level of the input-output signal DQ[7:0].

The IO signal processing circuit 101 normally toggles the pair of strobe signals DQS and /DQS when transmitting data by the input-output signal DQ[7:0]. However, when the memory chip 100 includes the interface circuit 210-2 for Type #2 electric signal, even if the pair of strobe signals DQS and /DQS are toggled by the interface circuit 210-2 for Type #2 electric signal, the interface circuit 210-1 for Type #1 electric signal in the controller 200 cannot correctly receive the pair of strobe signals DQS and /DQS. For that reason, in an example of FIG. 6, the memory chip 100 is configured not to toggle the pair of strobe signals DQS and /DQS when transmitting a response to the interface identification command. In determination of a timing for taking in the response, the controller 200 can use an elapsed period of time based on a timing of the toggle of the pair of read enable signals RE and /RE instead of using the pair of strobe signals DQS and /DQS. For example, as described above, the controller 200 takes in the response when the elapsed period of time reaches a predetermined period of time that is longer than the tDQSRE.

After the processing of S104 or S105 in FIG. 5 is completed and an interface circuit in the interface circuit 210-1 and the interface circuit 210-2, which is used by the controller 200 for communication, is determined, the memory chip 100 toggles the pair of strobe signals DQS and /DQS when transmitting data by the input-output signal DQ[7:0]. The controller 200 can take in the DQ[7:0] transmitted from the memory chip 100 at rising and falling times of the pair of strobe signals DQS and /DQS.

As described above, according to the first embodiment, the controller 200 is connected to the memory chip 100 via the first signal line (for example, the signal line for transmitting the input-output signal DQ[7:0], the signal line for transmitting the strobe signal DQS, and the signal line for transmitting the strobe signal /DQS). The controller 200 transmits, via the first signal line, the first command (for example, the interface identification command) to the memory chip 100 using the first electric signal (for example, the Type #1 electric signal) whose voltage transitions in the first range (for example, the range from 0 volt to the power supply voltage Vcc shown in FIG. 4). The controller 200 switches an electric signal, which is used for communication with the memory chip 100 via the first signal line, from the first electric signal to the second electric signal (for example, the Type #2 electric signal) whose voltage transitions in the second range (for example, the range from 0 volt to V1 shown in FIG. 4) narrower than the first range.

Therefore, even if the memory chip 100 does not include both interface circuits for the two different types of input-output standards, the controller 200 can communicate with the memory chip 100. That is, the unused redundant interface circuit of the interface circuits for the two different types of input-output standards can be omitted from the memory chip 100. By omitting the redundant interface circuit from the memory chip 100, an unnecessary increase in a capacitance of the first signal line can be avoided. Accordingly, the transmission rate of data via the first signal line is improved, and the power consumption required for the transmission is reduced. In other words, the performance of the memory system is improved. The effect of improving the performance of the memory system increases as the number of memory chips 100 commonly connected to the first signal line increases.

Further, according to the first embodiment, the controller 200 receives an electrical signal of the response via the first signal line. When a voltage of the electric signal of the response is not the second value (for example, the power supply voltage Vcc), the controller 200 switches the electric signal, which is used for the communication with the memory chip 100 via the first signal line, from the first electric signal to the second electric signal. Further, when the voltage of the electric signal of the response is the second value, the controller 200 does not switch the electric signal used for the communication with the memory chip 100 via a specific signal line.

The second electric signal cannot output the voltage of the second value (for example, the power supply voltage Vcc). Since the memory chip 100 is configured as described above, the controller 200 can identify for which of the two types of input-output standards the interface circuit is provided.

Further, according to the first embodiment, when the memory chip 100 includes a first interface circuit (for example, the interface circuit 120-1) capable of transmitting and receiving the first electric signal, the memory chip 100 sets a voltage of the first signal line (for example, the input-output signal DQ[7:0]) to the second value (for example, the power supply voltage Vcc). When the memory chip 100 includes a second interface circuit (for example, the interface circuit 120-2) capable of transmitting and receiving the second electric signal, the memory chip 100 sets the voltage of the first signal line to the first value (for example, 0 volt).

Accordingly, the controller 200 can identify which of the interface circuits of the two types of input-output standards is provided in the memory chip 100.

Further, according to the first embodiment, the memory chip 100 and the controller 200 are connected by the second signal line capable of transmitting the read enable signals RE and /RE. When receiving the read enable signals RE and /RE (more specifically, the toggle of the read enable signals RE and /RE) from the second signal line after receiving the first command, the memory chip 100 sets the voltage of the first signal line (for example, the input-output signal DQ[7:0]) to the first value (for example, 0 volt) or the second value (for example, the power supply voltage Vcc) by an interface circuit in the interface circuit 120-1 and the interface circuit 120-2 which is provided in the memory chip 100. The controller 200 takes in a signal of the first signal line at a timing after an elapsed period of time from the transmission of the first command reaches a fourth value (for example, the period of time tDQSRE).

Accordingly, the controller 200 can take in the response from the memory chip 100 without using the pair of strobe signals DQS and /DQS.

Further, in the first embodiment, the input-output standard of the first interface circuit (for example, the interface circuit 120-1) is SSTL, and the input-output standard of the second interface circuit (for example, the interface circuit 120-2) is LVSTL.

The input-output standard of each interface circuit is not limited thereto.

In the above description, the transition range of the voltage of the Type #1 electric signal, which is the first electric signal, is a range from 0 volt to the power supply voltage Vcc, the transition range of the voltage of the Type #2 electrical signal, which is the second electrical signal, is a range from 0 volt to V1 which is smaller than the power supply voltage Vcc, the first value is 0 volt, the second value is the power supply voltage Vcc, and the third value is V1. The transition ranges of the voltages of the electric signals according to respective input-output standards, the first value, the second value, and the third value, are not limited thereto.

For example, the first range, which is the transition range of the voltage of the first electric signal, may be a range from 0 volt to the power supply voltage Vcc, and the second range, which is the transition range of the voltage of the second electric signal, may be a range from a voltage value (referred to as V2) larger than 0 volt and smaller than the power supply voltage Vcc to the power supply voltage Vcc. The power supply voltage Vcc, which is an upper limit of the first range and an upper limit of the second range, may be the first value, 0 volt, which is a lower limit of the first range, may be the second value, and V2, which is a lower limit of the second range, may be the third value. In such a configuration, the controller 200 can also identify which of the interface circuits of the two types of input-output standards is provided depending on whether the voltage of the electrical signal of the response is the second value (that is, 0 volt).

Second Embodiment

In the first embodiment, the response from the memory chip 100 is described as being transmitted to the controller 200 by the input-output signal DQ[7:0]. The signal used for transmitting the response is not limited to the input-output signal DQ[7:0]. In a second embodiment, the ready busy signal RyBy is described as another example of the signal used for transmitting the response. A signal line for transmitting the ready busy signal RyBy corresponds to a third signal line.

In the second embodiment, matters different from those in the first embodiment will be mainly described. The same matters as in the first embodiment will be briefly described or omitted.

Figure 7A:
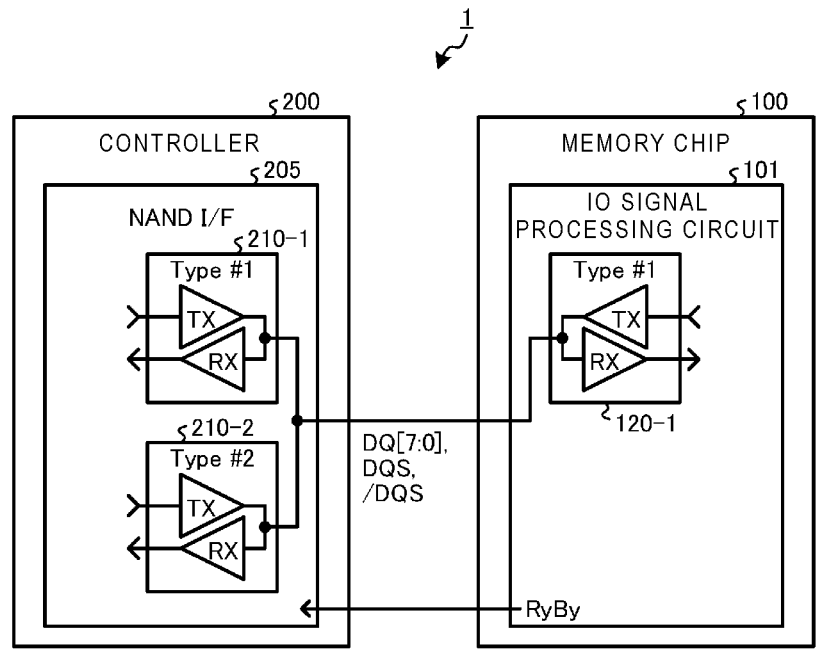
FIGS. 7A and 7B are diagrams of interface circuits of a controller and a memory chip according to a second embodiment.
Figure 7B:
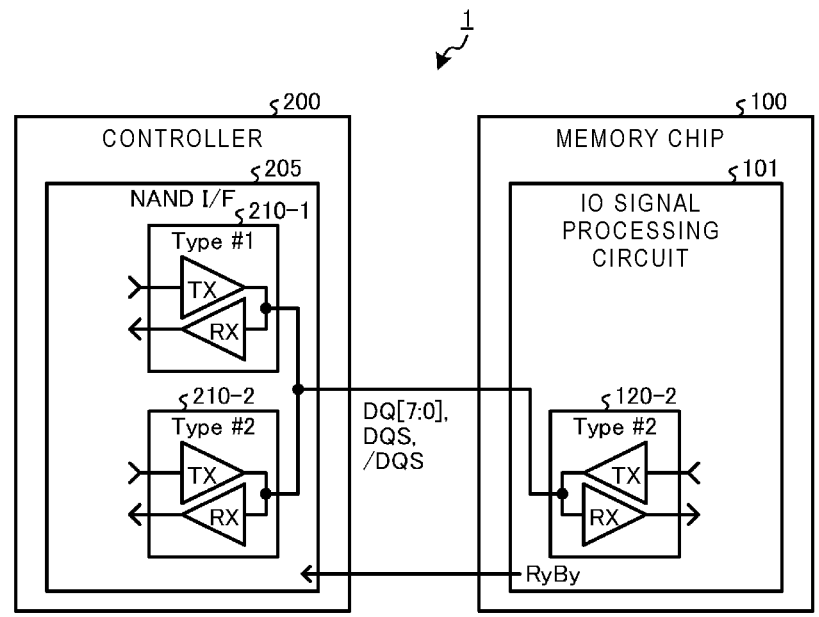

Each of FIG. 7A and FIG. 7B is a diagram showing a configuration example of respective interface circuits of the controller 200 and the memory chip 100 according to the second embodiment.

In an example shown in FIG. 7A and an example shown in FIG. 7B, the NAND interface circuit 205 provided in the controller 200 includes the interface circuit 210-1 that can transmit and receive the Type #1 electrical signal and the interface circuit 210-2 that can transmit and receive the Type #2 electrical signal. The interface circuit 210-1 and the interface circuit 210-2 are provided for each first signal line in a signal line group implementing the NAND bus 400. The pair of the interface circuit 210-1 and the interface circuit 210-2 are commonly connected to each first signal line. The first signal line is, for example, a signal line for transmitting the DQ[7:0], a signal line for transmitting the DQS, and a signal line for transmitting the /DQS.

According to the example shown in FIG. 7A, the IO signal processing circuit 101 provided in the memory chip 100 includes, for each first signal line, the interface circuit 120-1 that can transmit and receive the Type #1 electric signal. Each first signal line is connected to the interface circuit 120-1 in the memory chip 100. The IO signal processing circuit 101 does not include an interface circuit that can transmit and receive the Type #2 electric signal.

Further, according to the example shown in FIG. 7B, the IO signal processing circuit 101 provided in the memory chip 100 includes, for each first signal line, the interface circuit 120-2 that can transmit and receive the Type #2 electric signal. Each first signal line is connected to the interface circuit 120-2 in the memory chip 100. The IO signal processing circuit 101 does not include an interface circuit that can transmit the Type #1 electric signal.

Further, in the example shown in FIG. 7A and the example shown in FIG. 7B, the controller 200 and the memory chip 100 are connected to each other by the ready busy signal RyBy. The memory chip 100 can transmit a response to an interface identification command by using the ready busy signal RyBy. The input-output standard of the ready busy signal RyBy is common to both the example shown in FIG. 7A and the example shown in FIG. 7B.

Type #1 is associated with the one of two states indicated by the ready busy signal RyBy, that is, the ready state (Ry) and the busy state (By), and Type #2 is associated with the other. Information of the association is stored in the RAM 202. When transmitting the response, the memory chip 100 transitions the state of the ready busy signal RyBy to a state corresponding to the input-output standard of the interface circuit provided in the memory chip 100. The controller 200 can specify the input-output standard of the interface circuit provided in the memory chip 100 by confirming the ready busy signal RyBy after transmitting the interface identification command.

Figure 8:
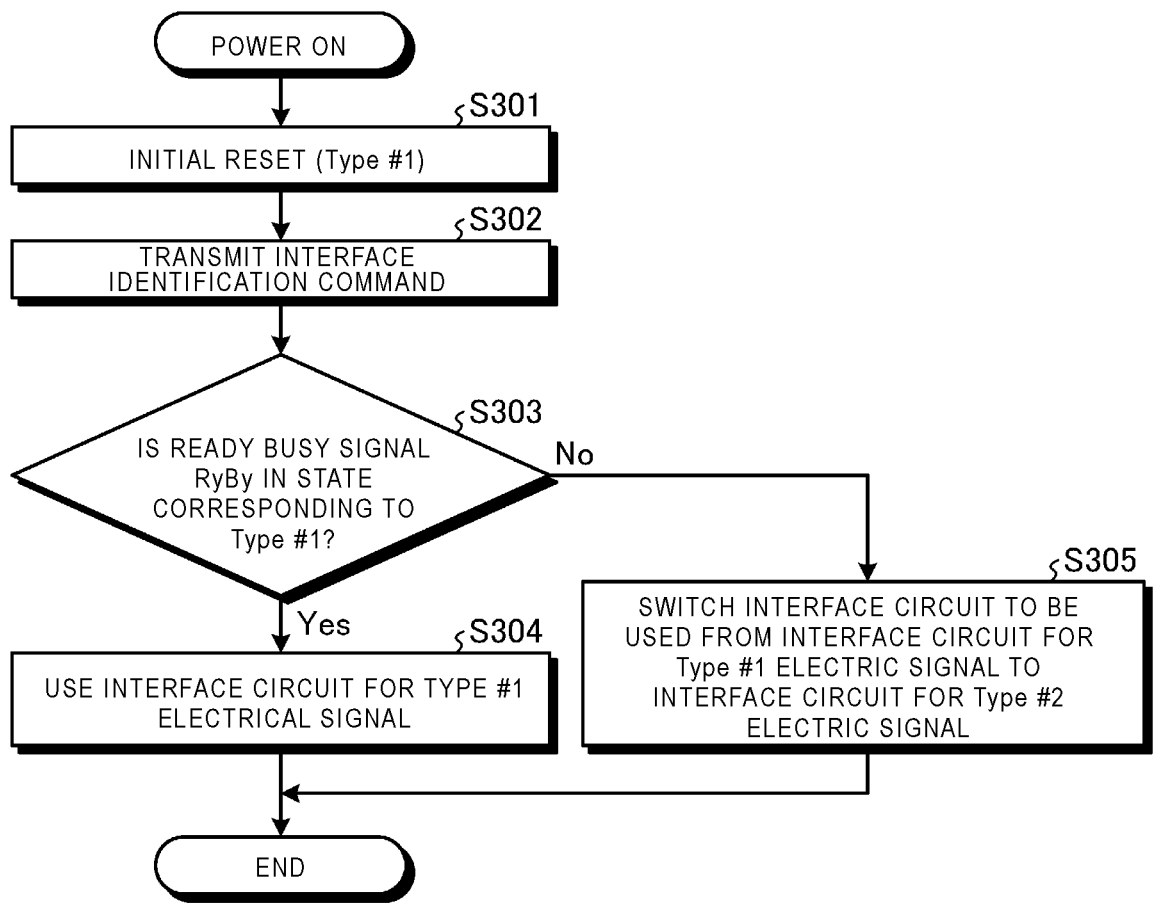
FIG. 8 is a flowchart of an operation of the controller according to the second embodiment.

FIG. 8 is a flowchart showing an example of an operation of the controller 200 according to the second embodiment.

In S301 and S302, the same processing as in S101 and S102 in FIG. 5 is executed.

Following S302, the controller 200 confirms whether the ready busy signal RyBy indicates the ready state (Ry) or the busy state (By). When the ready busy signal RyBy indicates a state to which Type #1 is associated (S303: Yes), the controller 200 determines that the interface circuit 210-1 for Type #1 electric signal will be used thereafter (S304). When the ready busy signal RyBy indicates a state to which Type #2 is associated (S303: No), the controller 200 switches the interface circuit to be used thereafter from the interface circuit 210-1 for Type #1 electric signal to the interface circuit 210-2 for Type #2 electric signal (S305).

The operation of the controller 200 according to the second embodiment is completed by S304 and S305. Thereafter, the controller 200 communicates with the two memory chips 100 by using the interface circuit determined by S304 or S305.

Figure 9:
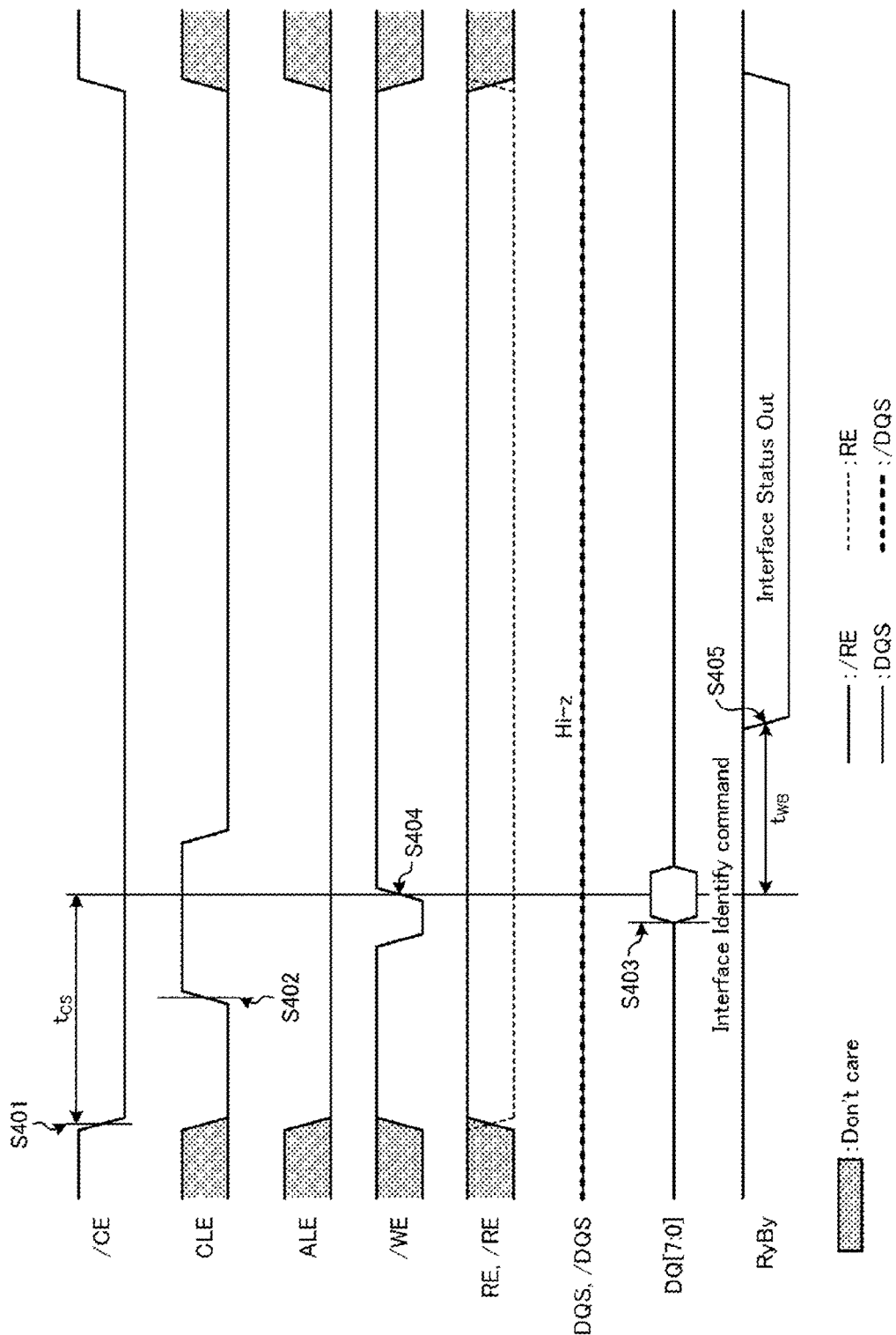
FIG. 9 is a timing chart showing an example of a state transition of a NAND bus during transmitting and receiving of an interface identification command and a response in a memory system according to a second embodiment.

FIG. 9 is a timing chart showing an example of a state transition of the NAND bus 400 during transmitting and receiving of an interface identification command and a response in the memory system 1 according to the second embodiment.

The same processing as that from S201 to S204 described with reference to FIG. 6 is executed from S401 to S404.

In the memory chip 100, the IO signal processing circuit 101 takes in the interface identification command by an interface circuit in the interface circuit 120-1 for type #1 electric signal and the interface circuit 120-2 for type #2 electric signal which is provided in the IO signal processing circuit 101. Thereafter, a response to the interface identification command is prepared until a predetermined period of time tWB elapses. Specifically, the interface identification command is transmitted from the IO signal processing circuit 101 to the command register 104 according to an instruction from the control signal processing circuit 102 that received the command latch enable signal CLE. The interface identification command in the command register 104 is read by the control circuit 103. The control circuit 103 determines a response content according to the interface identification command, and causes the RyBy generation circuit 108 to output the ready busy signal RyBy corresponding to the response content (S405). For example, when a state corresponding to Type #1 is set to the ready state (Ry) and a state corresponding to Type #2 is set to the busy state (By), if the memory chip 100 including an interface circuit includes the interface circuit 120-1 for Type #1 electric signal, the control circuit 103 causes the RyBy generation circuit 108 to output the ready state (Ry). For example, when the memory chip 100 including an interface circuit includes the interface circuit 120-2 for Type #2 electric signal, the control circuit 103 causes the RyBy generation circuit 108 to output the busy state (By).

The controller 200 can receive the ready busy signal RyBy as the response to the interface identification command after an elapsed period of time from the transmission of the interface identification command reaches the period of time tWB.

As described above, according to the second embodiment, the memory chip 100 is configured to transmit a response to the first command (for example, the interface identification command) by using the ready busy signal RyBy.

Third Embodiment

According to the examples of the two input-output standards described with reference to FIG. 4, both the signal transmitted as an L level signal and the signal transmitted as an H level signal by the transmission circuit TX for Type #2 electric signal are received as an L level signal in the reception circuit RX for Type #1 electric signal.

In a third embodiment, a pull-up resistor is connected to each first signal line. The memory system 1 is configured such that even if the Type #2 electrical signal is transmitted by the transmission circuit TX for Type #2 electric signal toward each first signal line, the type #1 reception circuit RX in the controller 200 can correctly receive the electric signal due to the pull-up resistor.

For example, when Type #1 and Type #2 have the configuration described with reference to FIG. 4, if an electric signal having a voltage of, for example, V1 is transmitted by the interface circuit for Type #2 electric signal, the voltage of the electric signal is shifted from V1 toward the power supply voltage Vcc by the pull-up resistor. Accordingly, the interface circuit for Type #1 electric signal can correctly receive the electric signal transmitted by the interface circuit for Type #2 electric signal.

Hereinafter, matters different from those in the first embodiment will be mainly described. The same matters as in the first embodiment will be briefly described or omitted.

Figure 10A:
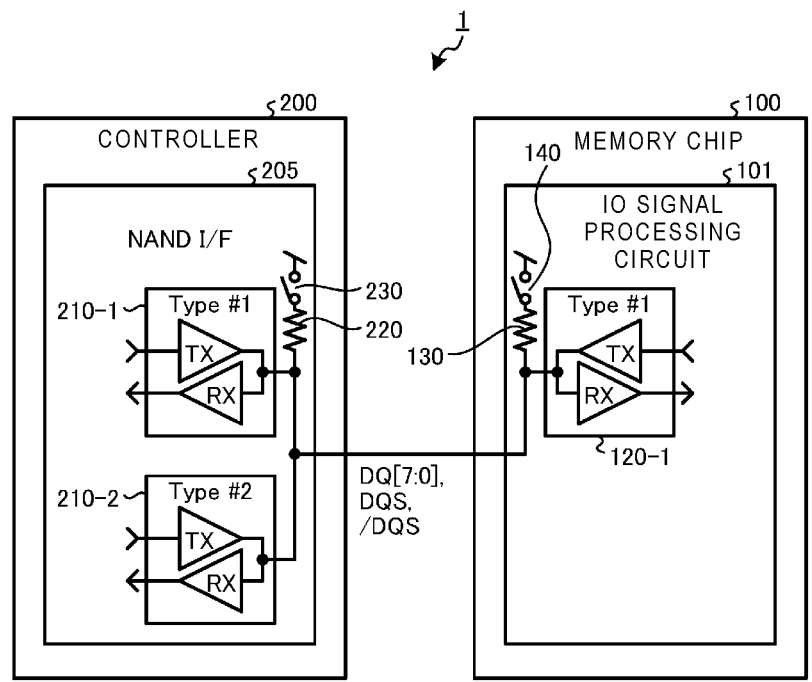
FIGS. 10A and 10B are diagrams of interface circuits of a controller and a memory chip according to a third embodiment.
Figure 10B:
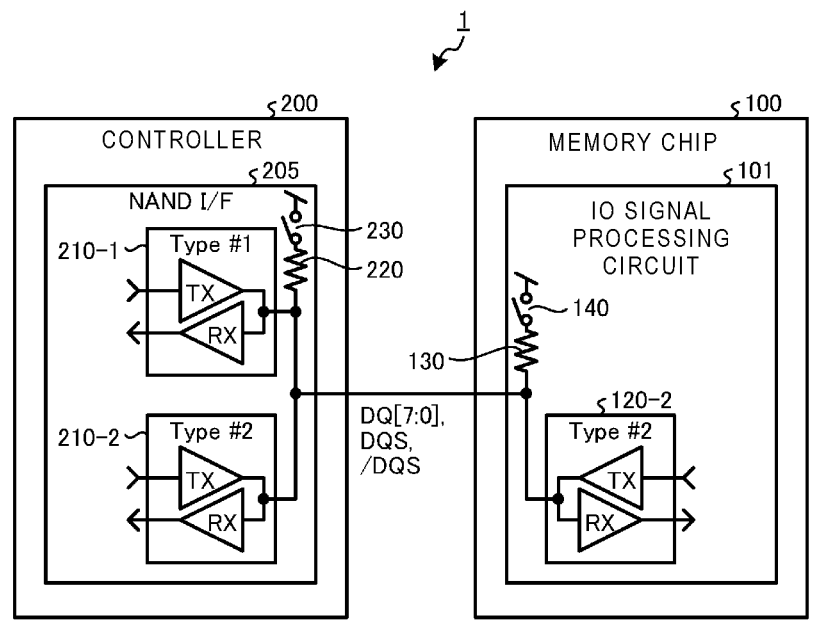

Each of FIG. 10A and FIG. 10B is a diagram showing a configuration example of respective interface circuits of the controller 200 and the memory chip 100 according to the third embodiment.

In an example shown in FIG. 10A and an example shown in FIG. 10B, the NAND interface circuit 205 provided in the controller 200 includes the interface circuit 210-1 that can transmit and receive the Type #1 electrical signal and the interface circuit 210-2 that can transmit and receive the Type #2 electrical signal. The interface circuit 210-1 and the interface circuit 210-2 are provided for each first signal line in a signal line group implementing the NAND bus 400. The pair of the interface circuit 210-1 and the interface circuit 210-2 are commonly connected to each first signal line.

Further, according to the example shown in FIG. 10A, the IO signal processing circuit 101 provided in the memory chip 100 includes, for each first signal line, the interface circuit 120-1 that can transmit and receive the Type #1 electric signal. Each first signal line is connected to the interface circuit 120-1 in the memory chip 100. The IO signal processing circuit 101 does not include an interface circuit that can transmit and receive the Type #2 electric signal.

Further, according to the example shown in FIG. 10B, the IO signal processing circuit 101 provided in the memory chip 100 includes, for each first signal line, the interface circuit 120-2 that can transmit and receive the Type #2 electric signal. Each first signal line is connected to the interface circuit 120-2 in the memory chip 100. The IO signal processing circuit 101 does not include an interface circuit that can transmit the Type #1 electric signal.

Further, in the example shown in FIG. 10A and the example shown in FIG. 10B, the controller 200 includes a pull-up resistor 220 connected to each first signal line. Even if the Type #2 electric signal is transmitted via the first signal line, the controller 200 can receive the Type #2 electric signal as the Type #1 electric signal by the pull-up resistor 220. As shown in FIGS. 10A and 10B, the controller 200 may include a switch 230 for switching between use and non-use of the pull-up resistor 220.

A pull-up resistor may be provided in the memory chip 100. In the example shown in FIG. 10A and the example shown in FIG. 10B, the memory chip 100 also includes a pull-up resistor 130 for each first signal line. Even if the interface circuit 120-2 for Type #2 electric signal transmits the Type #2 electrical signal to the first signal line, the memory chip 100 can convert the Type #2 electric signal into the Type #1 electric signal by using the pull-up resistor 130 and transmit the Type #1 electric signal. As shown in FIGS. 10A and 10B, the memory chip 100 may include a switch 140 for switching between use and non-use of the pull-up resistor 130.

The pull-up resistor (the pull-up resistor 220 or the pull-up resistor 130) may be provided in both the controller 200 and the memory chip 100 as shown in FIGS. 10A and 10B, or may be provided in either the controller 200 or the memory chip 100.

Figure 11:
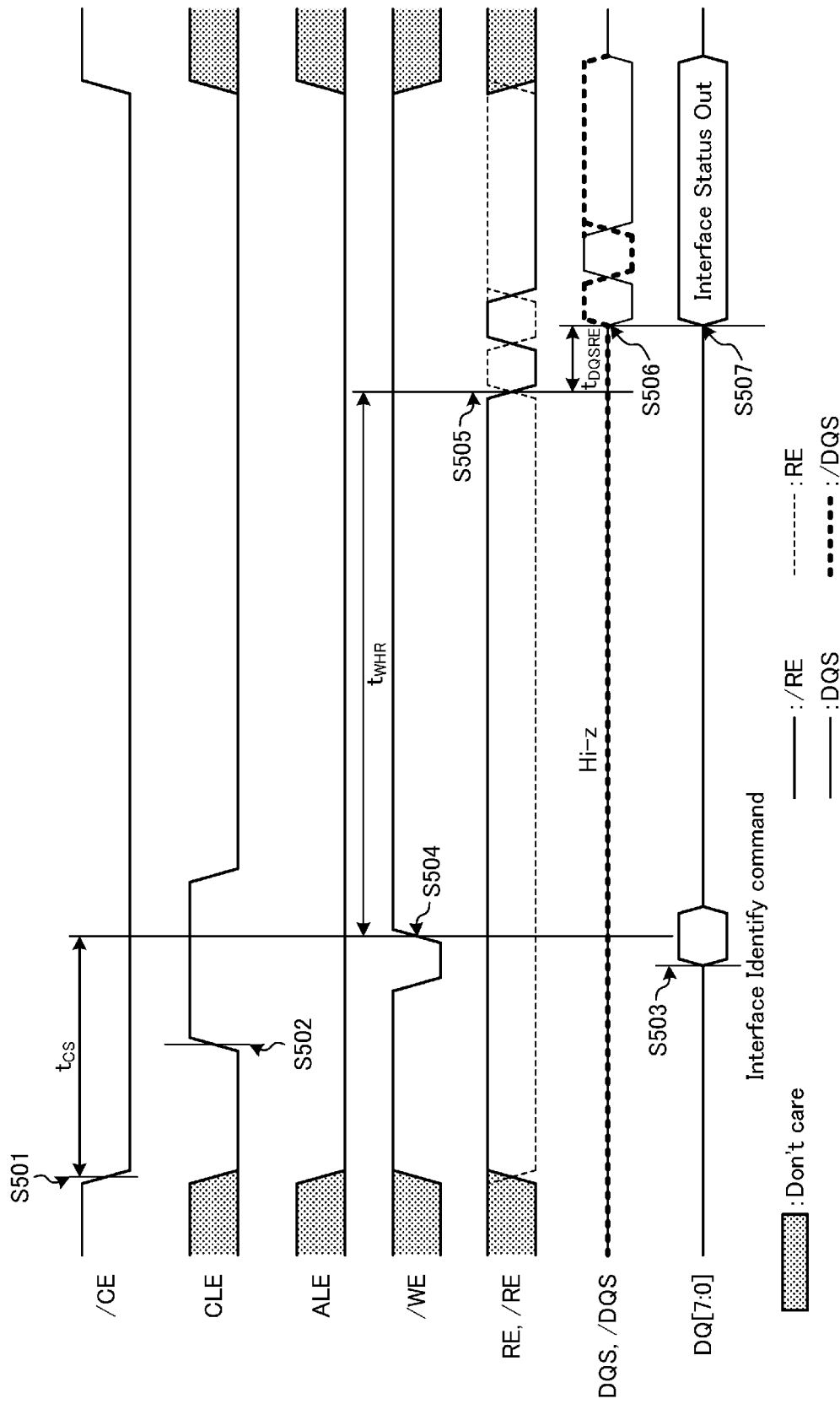
FIG. 11 is a timing chart showing an example of a state transition of a NAND bus during transmitting and receiving of an interface identification command and a response in a memory system according to a third embodiment.

FIG. 11 is a timing chart showing an example of a state transition of the NAND bus 400 during transmitting and receiving of an interface identification command and a response in the memory system 1 according to the third embodiment. Here, the type of the input-output standard of the electrical signals of the signals /CE, CLE, ALE, /WE, RE, and /RE is a predetermined type (for example, Type #1) in which the electrical signals are transmitted. Further, the signals DQ[7:0], DQS, and /DQS are to be transmitted as the Type #1 electrical signal by an operation of the pull-up resistor 220 and the pull-up resistor 130.

The same processing as that from S201 to S204 described with reference to FIG. 6 is executed from S501 to S504.

The controller 200 toggles a pair of read enable signals RE and /RE when the period of time tWHR elapses since the interface identification command is transmitted (S505). In the memory chip 100, when detecting the toggle of the pair of read enable signals RE and /RE, the control signal processing circuit 102 causes the IO signal processing circuit 101 to output, using the input-output signal DQ[7:0], an electric signal corresponding to the information stored in the status register 106. For example, when the IO signal processing circuit 101 includes the interface circuit 120-1 for Type #1 electric signal, the IO signal processing circuit 101 transmits an H level signal as the input-output signal DQ[7:0] by the interface circuit 120-1. When the IO signal processing circuit 101 includes the interface circuit 120-2 for Type #2 electric signal, the IO signal processing circuit 101 transmits an L level signal as the input-output signal DQ[7:0] by the interface circuit 120-2. Accordingly, the controller 200 is in a state of being able to receive an H level response or an L level response by the interface circuit 210-1.

In the third embodiment, a correspondence between a signal level of the input-output signal DQ[7:0] and the input-output standard is not limited to the above-described relationship. This is because regardless of whether the IO signal processing circuit 101 includes the interface circuit 120-1 for Type #1 electric signal or the interface circuit 120-2 for Type #2 electric signal, an electrical signal of the response is transmitted as the Type #1 electrical signal by the pull-up resistors (the pull-up resistor 220 and the pull-up resistor 130) connected to the signal line of the input-output signal DQ[7:0].

When the period of time tDQSRE elapses which is required from when the pair of read enable signals RE and /RE are toggled to when the IO signal processing circuit 101 starts to transmit the response, the IO signal processing circuit 101 toggles the pair of strobe signals DQS and /DQS (S506).

The pair of strobe signals DQS and /DQS, similarly to the input-output signal DQ[7:0], is transmitted as the Type #1 electrical signal by the pull-up resistors (the pull-up resistor 220 and the pull-up resistor 130). Therefore, the interface circuit 210-1 for Type #1 electric signal provided in the controller 200 can correctly receive the pair of strobe signals DQS and /DQS. The controller 200 takes in the response, that was output using the input-output signal DQ[7:0], at a time when the pair of strobe signals DQS and /DQS are toggled (S507).

In the third embodiment, an example in which the two types of input-output standards shown in FIG. 4 are applied was described. The memory system 1 may include a pull-down resistor instead of the pull-up resistor depending on a relationship between the two types of input-output standards.

For example, when the first range, which is the transition range of the voltage of the first electric signal, is a range from 0 volt to the power supply voltage Vcc, and the second range, which is the transition range of the voltage of the second electric signal, is a range from a voltage value (referred to as V2) larger than 0 volt and smaller than the power supply voltage Vcc to the power supply voltage Vcc, the memory system 1 may include a pull-down resistor that shifts the voltage value V2 towards 0 volt.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A memory system, comprising:
a memory chip;
one or more signal lines including a first signal line; and
a controller connected to the memory chip via the one or more signal lines and configured to transmit and receive signals via the first signal line in accordance with a first standard under which voltages of communicated signals transition in a first voltage range and with a second standard under which voltages of communicated signals transition in a second voltage range narrower than the first voltage range, wherein
the first voltage range is from a first voltage value to a second voltage value higher than the first voltage value, and the second voltage range is from the first voltage value to a third voltage value that is higher than the first voltage value and lower than the second voltage value, and
the controller is configured to transmit a command to the memory chip via the first signal line in accordance with the first standard, and based on a response to the command from the memory chip, enable communication in accordance with the second standard.

2. The memory system according to claim 1, wherein
the controller includes a first interface circuit configured to transmit and receive signals via the first signal line in accordance with the first standard and a second interface circuit configured to transmit and receive signals via the first signal line in accordance with the second standard, and based on the response to the command from the memory chip, the controller disables the first interface circuit and enables the second interface circuit.

3. The memory system according to claim 1, wherein
when the response is a signal at one of a high (H) level or a low (L) level, the controller maintains communication in accordance with the first standard, and when the response is a signal at the other one of the high (H) or the low (L) level, the controller disables communication in accordance with the first standard and enables communication in accordance with the second standard.

4. The memory system according to claim 1, wherein the memory chip is compatible with only one of the first and second standards, and the response indicates the one of the first and second standards with which the memory chip is compatible.

5. The memory system according to claim 4, wherein the memory chip is compatible with the first standard, and not with the second standard.

6. The memory system according to claim 4, wherein the memory chip is compatible with the second standard, and not with the first standard.

7. The memory system according to claim 1, wherein the controller is configured to receive the response via the first signal line.

8. The memory system according to claim 7, wherein the controller is configured to transmit and receive input-output (I/O) signals via the first signal line.

9. The memory system according to claim 7, wherein
the one or more signal lines include a second signal line different from the first signal line, the memory chip is configured to transmit the response when the memory chip receives a signal from the controller via the second signal line after receiving the command via the first signal line, and the controller is configured to read a voltage level of the first signal line as the response a predetermined period time after the controller transmits the signal via the second signal line.

10. The memory system according to claim 1, wherein the one or more signal lines include a third signal line different from the first signal line, and the controller is configured to receive the response via the third signal line.

11. The memory system according to claim 10, wherein the controller is configured to receive a ready busy signal from the memory chip via the third signal line.

12. The memory system according to claim 1, wherein the controller includes one of a pull-up resistor and a pull-down resistor connected to the first signal line.

13. The memory system according to claim 1, wherein the memory chip includes one of a pull-up resistor and a pull-down resistor connected to the first signal line.

14. The memory system according to claim 1, wherein the first standard is Stub Series Termination Logic (SSTL) and the second standard is Low Voltage Swing Terminated Logic (LVSTL).

15. A controller connectable to a memory chip, the controller comprising:
one or more signal lines connectable to a memory chip, the one or more signal lines including a first signal line; and an interface circuit connected to the one or more signal lines and configured to transmit and receive signals via the first signal line in accordance with a first standard for which voltages of communicated signals transition in a first voltage range and with a second standard for which voltages of communicated signals transition in a second voltage range narrower than the first voltage range, wherein the first voltage range is from a first voltage value to a second voltage value higher than the first voltage value, and the second voltage range is from the first voltage value to a third voltage value that is higher than the first voltage value and lower than the second voltage value, and the interface circuit is configured to transmit a command to the memory chip via the first signal line in accordance with the first standard, and based on a response to the command from the memory chip, enable communication in accordance with the second standard.

16. The memory system according to claim 1, wherein
a signal of a high (H) level communicated via the first signal line in accordance with the first standard is at the second voltage value, and a signal of a high (H) level communicated via the first signal line in accordance with the second standard is at the third voltage value.

17. The memory system according to claim 16, wherein
a signal of a low (L) level communicated via the first signal line in accordance with the first standard is at the first voltage value, and a signal of a low (L) level communicated via the first signal line in accordance with the second standard is at the first voltage value.

18. The memory system according to claim 17, wherein a voltage value that is used to distinguish the signal of the H level communicated via the first signal line in accordance with the first standard from the signal of the L level communicated via the first signal line in accordance with the first standard is greater than the third voltage value.

19. The memory system according to claim 1, wherein the controller is configured to perform a reset operation to enable communication in accordance with the first standard and disable communication in accordance with the second standard upon the memory system being powered on, and transmit the command upon the reset operation being completed.

* * * * *